United States Patent [19]

Ovshinsky et al.

[11] Patent Number: 4,668,968
[45] Date of Patent: May 26, 1987

[54] INTEGRATED CIRCUIT COMPATIBLE THIN FILM FIELD EFFECT TRANSISTOR AND METHOD OF MAKING SAME

[75] Inventors: Stanford R. Ovshinsky, Bloomfield Hills; Stephen J. Hudgens, Southfield, both of Mich.

[73] Assignee: Energy Conversion Devices, Inc., Troy, Mich.

[21] Appl. No.: 610,130

[22] Filed: May 14, 1984

[51] Int. Cl.[4] ...................... H01L 29/04; H01L 29/54
[52] U.S. Cl. ........................................ 357/2; 357/23.7; 357/15; 357/23.2
[58] Field of Search ................... 357/23.7, 23.2, 2, 15

[56] References Cited

U.S. PATENT DOCUMENTS 3,304,469  2/1967  Weimer ........................... 357/23.7
3,924,320  12/1975  Altman et al. ................... 357/15
4,226,898  10/1980  Ovshinsky et al. .............. 357/2

FOREIGN PATENT DOCUMENTS 2913068  10/1980  Fed. Rep. of Germany ........ 357/22 MD
2067353  7/1981  United Kingdom ............... 357/2

OTHER PUBLICATIONS

Matsui et al., "Thin-Film Transistors on Molecular-Beam-Deposited Polycrytalline Silicon," *J. of Applied Physics*, vol. 55, No. 6, 3/15/84, pp. 1590–1595.

Ymasaki et al., "A Liquid Crystal TV Display Panel with Drivers," *SID 82 Digest*, pp. 48 and 49.

Fischer et al., "P-Type TFT w/Vacuum-Deposited Cryst. Cu-doped Ge Films," *IEEE Elec. Device Letters*, vol. EDL-4, No. 12, 12/83.

*Primary Examiner*—Andrew J. James
*Assistant Examiner*—Jerome Jackson
*Attorney, Agent, or Firm*—M. S. Siskind; R. M. Goldman

[57] ABSTRACT

There is disclosed integrated circuit compatible thin film field effect transistors which can be fabricated at low temperatures and operated at fast switching rates for use, for example, in video rate applications. The transistors include a body of germanium semiconductor material having a structure more ordered than amorphous material and less ordered than single crystalline material. The source and drain of the transistors comprises rectifying contacts formed on or in the body of germanium semiconductor material. Also disclosed are a method of making the transistors and an electronically addressable array system utilizing the transistors to advantage.

31 Claims, 4 Drawing Figures

INTEGRATED CIRCUIT COMPATIBLE THIN FILM FIELD EFFECT TRANSISTOR AND METHOD OF MAKING SAME

FIELD OF THE INVENTION

The present invention generally relates to integrated circuit compatible thin film field effect transistors and a method of making the transistors. The invention more particularly relates to thin film field effect transistors which are capable of operating at switching speeds not heretofore obtainable in applications where such high speed operation is essential. Such applications include matrix array addressing systems wherein the addressing circuits are integral to the array and are required to operate at video rates. The transistors and method of the present invention are ideally suited for such addressing circuit applications because the transistors can be formed under temperature conditions which do not adversely affect the matrix array components.

BACKGROUND

Electronic matrix arrays find considerable application in systems such as, for example, liquid crystal displays and high density memories. Such systems generally include X and Y address lines which are vertically spaced apart and cross at an angle to form a plurality of crossover points. Associated with each crossover point is an element to be selectively addressed. The elements can be, for example, the liquid crystal display pixels of a liquid crystal display or the memory cells of an electronically addressable memory array.

Some form of isolation device is generally associated with each array element. The isolation elements permit the individual elements to be selectively addressed by the application of suitable read potentials between respective pairs of the X and Y address lines.

Amorphous semiconductor thin film field effect transistors have found wide usage for the isolation devices in such arrays. Thin film field effect transistors formed from deposited semiconductors, such as amorphous silicon alloys are ideally suited for such applications because they exhibit a very high dark resistivity and therefore have very low reverse leakage currents. The reverse leakage currents are so low that very high on to off current ratios are made possible for effectively isolating the non-addressed array elements from the array elements being addressed.

While thin film field effect transistors formed from amorphous semiconductor alloys are ideally suited as isolation devices in addressable arrays, they are not so ideally suited for use in forming the addressing circuitry required for the selective addressing of the array elements. One reason for this is that these devices have not exhibited the switching speeds required for these applications.

For many applications, the components forming the addressing circuitry of electronically addressable arrays are required to switch at video rates, on the order of 50 megahertz, for example. Such is the case particularly in liquid crystal displays or fast read-out memories. Structurally, thin film field effect transistors generally include source and drain electrodes, a semiconductor material between the source and drain electrodes, and a gate electrode in proximity to the semiconductor but electrically insulated therefrom by a gate insulator. Current flow through the transistor between the source and drain is controlled by the application of a voltage to the gate electrode. The voltage on the gate electrode produces an electric field which accumulates a charged region near the semiconductor-gate insulator interface. This charged region forms a current conducting channel in the semiconductor through which the device current is conducted.

In thin film field effect transistors, both output current and operating speed are directly related to the structural configurations of the devices and to the field effect mobility of the semiconductor material. The output current is directly proportional to the field effect mobility and is almost always inversely proportional to the current conduction channel length. The maximum operating frequency of such a device is related to the channel length which is fixed by the spacing between the source and drain electrodes in a more complicated manner. The reason for this is that the operating frequency is not only related to the channel length, but is also dependent upon the total capacitance of the device. The total capacitance has basically two components, a fixed capacitance due to electrode overlap, and a dynamic capacitance that results when the current conduction channel is formed. The fixed capacitance is a direct function of the electrode overlap. The dynamic capacitance however is inversely proportional to the channel length. Since both the output current and the dynamic capacitance are both inversely proportional to the channel length, the maximum operating frequency should be inversely proportional to the square of the channel length if the fixed capacitance is disregarded. Unfortunately, the fixed capacitance cannot be disregarded. As a result, as long as there remains some fixed capacitance, the total expected improvement in device speed with reduced channel length cannot be realized. For this reason, even though a thin film field effect transistor may have a narrow channel, the frequency response of the device can still be limited by the fixed capacitance and the field effect mobility. The fixed capacitance can be the result of device design or process constraints imposed by limited photolithographic resolution. The field effect mobility is generally fixed by the type of semiconductor used to form the device and is generally low for amorphous semiconductor alloy devices.

Thin film field effect transistors have been made by processes including conventional 10 micron photolithography. Such conventional processes have resulted in minimum channel lengths on the order of the conventional feature size of 10 microns. Such channel lengths with the field effect mobilities of amorphous semiconductor alloys have resulted in relatively slow speed devices. One way to overcome the limitations inherent in conventional photolithographic resolution is to utilize a vertical structure where the current conduction channel length is determined by the vertical separation of the source and drain electrodes, as described and claimed in commonly assigned copending U.S. patent application Ser. No. 529,299 for Thin Film Transistor, filed in the names of Richard A. Flasck, et al. The transistor therein disclosed includes source and drain regions vertically displaced with respect to each other relative to a substrate and having a deposited semiconductor therebetween. The length of the current conduction channel is a function of the vertical displacement distance between the source and drain electrodes and is substantially independent of the constraints otherwise imposed by standard 10 micron photolithography.

The aforementioned U.S. patent application Ser. No. 529,299 of Richard A. Flasck, et, al., for Thin Film Transistor is a continuation of U.S. patent application Ser. No. 280,378, filed Nov. 19, 1980, for Thin Film Transistor, which in turn was a continuation of U.S. patent application Ser. No. 103,011, filed Dec. 13, 1979, for Deposited Film Memory Systems.

Further improvements in vertically arrayed thin film field effect transistor structures are described in the commonly assigned copending U.S. patent application Ser. No. 549,996 of Hellmut Fritsche, et al., filed Nov. 8, 1983 for High Performance, High Voltage, Small Area Thin Film Transistor and Method of Making Same. The vertical thin film field effect transistor therein disclosed includes source and drain electrodes vertically displaced with respect to each other and relative to a substrate, with an insulating layer therebetween. A semiconductor extends along the non-coplanar or diagonal edges of the source and drain electrodes and the insulating layer.

Further, improvements in vertically arrayed thin film field effect transistor structures are described in the commonly assigned copending U.S. patent application Ser. No. 550,234 of Zvi Yaniv, et al., filed on November 8, 1983, for High Performance Thin Film Transistor Having Improved Carrier Injection. The transistor therein disclosed includes source and drain electrodes vertically displaced with respect to each other relative to a substrate, with a deposited semiconductor extending along the non-coplanar or diagonal edges of the source and drain electrodes, wherein the contacts between the semiconductor and the source and drain electrodes include an ohmic contact enhancement means incorporated therein. Further improvements in vertical thin film field effect transistor structures are described in the commonly assigned copending U.S. patent application Ser. No. 549,979 of Gregory Hansell, et al., filed on Nov. 8, 1983 for Thin Film Transistor Having Annealed Gate Oxide and Method of Making Same. The transistors therein disclosed have an annealed insulator layer between the gate electrode and the semiconductor.

Common to all of the above described field effect transistors is a vertical structure, that is, a structure where the drain is vertically displaced from the source. All of these transistor structures provide a current conduction channel length of one micron or less while still allowing the use of conventional photolithography during the fabrication of the devices.

A horizontal thin film field effect transistor having a short current conduction channel in a deposited semiconductor between closely spaced source and drain electrodes is fully described in copending and commonly assigned U.S. patent application Ser. No. 557,773, filed on Dec. 5, 1983 in the names of Mohshi Yang and David Vesey, for Short Channel Thin Film Field Effect Transistor. This transistor has a generally horizontal structure. The source and drain electrodes are in contact with a semiconductor, and separated from each other by a dimension less than the feature size of conventional photolithographic processess.

As described therein, the source and drain electrodes are formed by forming a thick film of photoresist over a first electrode material, exposing the photoresist through a photomask, developing the photoresist, etching the underlying electrode material to undercut the photoresist to form one electrode, and thereafter, without removal of the remaining photoresist, shadow depositing the other electrode. The shadow deposition is carried out from a unidirectional or collimated source. As a result, deposition is avoided within the shadow of the photoresist which can be on the order of one micron or less in dimension to form the closely spaced source and drain electrodes.

While the transistor and process described immediately above provide significant improvements to planar or generally horizontal thin film field effect transistors, there remains some overlap of the drain and source electrodes with the gate electrode. It has been determined that even though these devices are capable of operating at speeds not heretofore possible for planar thin film field effect transistors, the fixed capacitance of the devices limits the operating speeds thereof to a point where all of the advantages of the short current conduction channel lengths cannot be fully obtained.

A further improvement in thin film field effect structures is disclosed in commonly assigned copending U.S. patent application Ser. No. 590,836, of Zvi Yaniv et al., filed Mar. 19, 1984, for Improved Reduced Capacitance Narrow Channel Thin Film Transistor And Method Of Making Same. The transistor structure there disclosed provides a thin film field effect transistor having substantially reduced capacitance as a result of having virtually no drain and source electrode overlap with the gate electrode while having a narrow current conduction channel. The transistor includes an insulative substrate, a gate electrode formed on the substrate, wherein the gate electrode has a minor dimension of about one micron or less. The transistor further includes a gate insulator overlying the gate electrode, and source and drain electrodes disposed over the gate insulator in non-overlapping relation to the gate and being spaced apart by a distance substantially equal to the gate minor dimension. A layer of semiconductor material is disposed between the source and drain electrodes in electrical connection therewith.

Each of the foregoing transistor structures disclosed in the above-referenced applications, which are assigned to the assignee of the present invention, represents a significant improvement in the amorphous semiconductor alloy thin film field effect transistor art. However, as previously mentioned, the switching speeds of these devices is not only dependent upon device configuration, but also is directly dependent upon the field effect mobility of the semiconductor through which the device current must pass. Unfortunately, amorphous semiconductor alloys exhibit relatively low field effect mobilities on the order of 0.1 to 1. Hence, even though improved device configurations have been made possible as described above, the field effect mobilities of these devices essentially preclude their use in applications such as in addressing circuitry, where video rate switching is often required. Further, while improved field mobilities are possible by annealing the gate oxides of these devices, the annealing must be performed at temperatures which are too high to avoid damage to the other circuit components associated with the circuit or system in which they are to be employed. For example, if hydrogen compensated amorphous semiconductor alloy devices are employed, the annealing temperatures would be high enough to dehydrogenate the devices and thus adversely affect their electrical characteristics.

In summary, while amorphous semiconductor alloy thin film field effect transistors are ideally suited for many applications, such as for isolating matrix array elements to be selectively addressed, they are not suited for use in applications where video rate switching is required in association with other components which would be adversely affected by the processing of the devices. For this particular and important application, a new and improved integrated circuit compatible thin film field effect transistor is required. The improved transistor must include a semiconductor material having high field effect mobility. It preferably should be adapted to be fabricated at low temperatures to avoid damage to other existing circuit elements associated therewith, and also should be adapted to be made using conventional 10 micron photolithography while still exhibiting fast switching rates at, for example, video rates of about 50 Mhz.

Thin film field effect transistors incorporating polycrystalline silicon have been fabricated and reported to exhibit switching rates in the 50 Mhz range. However, as also reported, these devices must be fabricated at high temperature. As a result, such devices are not compatible with integrated circuits utilizing amorphous silicon field effect transistors or circuits fabricated on inexpensive substrate materials which cannot be processed at high temperature.

In contrast, the present invention provides a significant improvement in the thin film field effect transistor and integrated circuit arts. The present invention not only provides a thin film field effect transistor capable of operating at video rate switching speeds, but in addition, provides such a device which can be fabricated at low temperature to avoid damage to other circuit components during the fabrication thereof. In addition, the thin film field effect transistor can be fabricated with conventional 10 micron photolithography allowing commercial use of the device in large area applications.

SUMMARY OF THE INVENTION

The invention provides an integrated circuit compatible thin film field effect transistor capable of operating at video switching rates and which can be formed at low temperatures. The transistor comprises a body of semiconductor material including a single semiconductor element, germanium. The germanium semiconductor material has a structure more ordered than amorphous germanium semiconductor material and less ordered than single crystalline germanium semiconductor material. The transistor further includes source and drain electrodes forming rectifying contacts with the body of germanium semiconductor material and a gate electrode adjacent to and insulated from the body of germanium semiconductor material.

The source and drain electrodes can be formed in or on the body of germanium semiconductor material. When the source and drain electrodes are formed in the body of germanium semiconductor material, they can be doped regions in the body of germanium semiconductor material such as those formed by ion implantation or diffused alloy processes. The doped regions are preferably n-type regions when the germanium semiconductor material is slightly p-type or p-type when the germanium semiconductor material is slightly ntype. When the source and drain electrodes are formed on the body of germanium semiconductor material, they can be deposits of a metal on the body of germanium semiconductor material or deposits of a doped semiconductor on the body of germanium semiconductor material.

The body of germanium semiconductor material can further include compensating elements such as hydrogen or fluorine.

The invention further provides a system for selectively addressing each element of an array of elements. The system includes a first set of address lines, and a second set of address lines spaced from and crossing at an angle to the first set of address lines to form a plurality of crossover points therewith wherein each crossover point is associated with a given one of the elements to be addressed and an isolation device. The system further includes addressing circuitry coupled to the first and second sets of address lines for selectively applying addressing potentials to respective pairs of the first and second sets of address lines. The addressing circuitry includes at least one integrated circuit compatible thin film field effect transistor comprising a body of semiconductor material including a single semiconductor element, germanium. The germanium semiconductor material has a structure more ordered than amorphous germanium semiconductor material and less ordered than single crystalline germanium semiconductor material. The transistor further includes source and drain electrodes formed by rectifying contacts with the body of germanium semiconductor material, and a gate electrode adjacent to and insulated from the body of germanium semiconductor material.

The invention further provides a method of making an integrated circuit compatible thin film field effect transistor. The method includes the steps of forming a body of semiconductor material including a single semiconductor element, germanium, wherein the germanium semiconductor material is formed to have structure more ordered than amorphous germanium semiconductor material and less ordered than single crystalline germanium semiconductor material, forming source and drain electrodes in rectifying contact with the body of germanium semiconductor material, and forming a gate electrode adjacent to and insulated from the body of germanium semiconductor material.

The body of germanium semiconductor material is preferably formed by vapor depositing the germanium semiconductor material onto a substrate which is heated to a temperature between 230° and 350° C. during the deposition of the germanium semiconductor material. The body of germanium semiconductor material is preferably deposited by molecular beam epitaxy.

The germanium semiconductor body can be annealed prior to forming the drain and source electrodes in a hydrogen gas atmosphere, in an atmosphere of hydrogen gas and a forming gas, in a hydrogen plasma, or in a fluorine plasma. The germanium semiconductor body can be annealed at a temperature of about 350° C. and at a pressure between 0.1 and 0.5 Torr.

DESCRIPTION OF THE PREFERRED EMBODIMENTS

Figure 1:
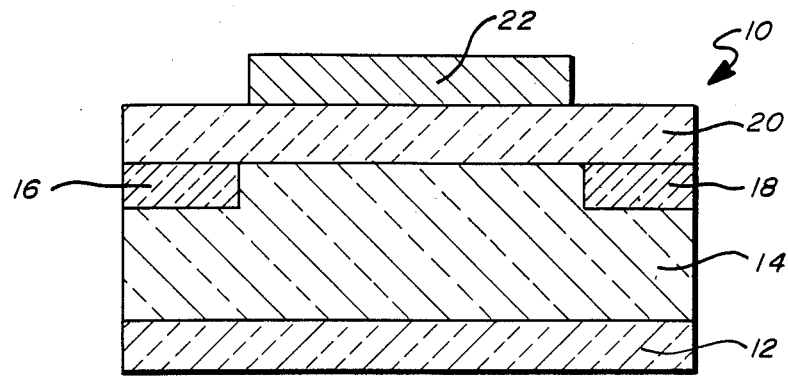
FIG. 1 is a cross-sectional side view of an integrated circuit compatible thin film field effect transistor embodying the present invention.

An integrated circuit compatible thin film field effect transistor 10 structured in accordance with a first embodiment of the present invention is illustrated in FIG. 1. The transistor 10 includes a substrate 12 which can be formed from an insulating material, such as glass, for example. Formed on the substrate 12 is a body 14 of semiconductor material. The body 14 of semiconductor material includes a single semiconductor element, germanium. The body of germanium semiconductor material 14 is formed to have a structure which is more ordered than amorphous material and less ordered than single crystalline germanium. Such material can include, for example, microcrystalline or polycrystalline germanium semiconductor material. By the term "amorphous" is meant an alloy or material which has long-range disorder, although it may have short or intermediate order or even contain at times some crystalline inclusions.

The body of germanium semiconductor material 14 can be formed to have such structure by vapor depositing the germanium semiconductor material by, for example, an MBE (molecular beam epitaxy) deposition of the type well known in the art. The deposition is preferably achieved using a target of powdered polycrystalline germanium. The substrate 12 is preferably heated to a temperature between 230° C. and 350° C. and the deposition pressure is preferably maintained at $10^{-8}$ Torr or less. Under these deposition conditions, the deposited body of germanium semiconductor material 14 will have indeed a more ordered structure than amorphous material and a less ordered structure than single crystalline material. More specifically, the germanium semiconductor material thus deposited will have a grain size ranging from 2,000 Å to 3,000 Å.

When the target of powdered polycrystalline germanium is intrinsic or non-intentionally doped, the resulting body of deposited germanium semiconductor material will be slightly p-type ($\pi$-type). As will be explained subsequently and in accordance with the present invention, it may be desired to make the body of germanium semiconductor material slightly n-type. Such material can be deposited by using a target of powdered polycrystalline germanium which has been lightly doped n-type.

After the body of germanium semiconductor material 14 is formed, the body 14 of germanium semiconductor material can be postcompensated by annealing in an atmosphere of hydrogen, an atmosphere of hydrogen and a forming gas such as nitrogen, in a hydrogen plasma, or in a fluorine plasma. The annealing process is preferably accomplished at a temperature of about 350° C. and a pressure between 0.1 to 0.5 Torr.

By annealing the body 14 of germanium semiconductor material as described above, the compensating elements such as hydrogen or fluorine are diffused into the body 14 of semiconductor material to compensate for dangling bonds or other structural defects which may exist in the material. The material after annealing can thus be considered a germanium semiconductor alloy incorporating either hydrogen or fluorine. The annealing in a hydrogen and nitrogen atmosphere is preferred inasmuch as the nitrogen serves as a forming gas to reduce defects at the grain boundaries of the material.

The transistor 10 further includes a source 16 and a drain 18. In accordance with this preferred embodiment, the source 16 and drain 18 are formed in the body 14 of germanium semiconductor material. The source 16 and drain 18 can take the form of doped regions within the semiconductor body 14. The doped regions preferably are of opposite conductivity with respect to the conductivity of the body 14 of germanium semiconductor material. For example, when the semiconductor body 14 is $\pi$-type (slightly p-type), the source 16 and drain 18 are preferably formed by n-type regions within the semiconductor body 14 and when the semiconductor body 14 is slightly n-type, the source 16 and drain 18 are preferably formed by p-type regions within the semiconductor body 14.

The source 16 and drain 18 can be formed by the implantation of the dopants. To that end, the top surface of the body 14 is masked with an oxide, such as silicon oxide, to expose the portions of the body 14 which are to be implanted. Thereafter, the dopant such as phosphorus for n-type source and drains, or boron for p-type source and drains is implanted into the body to form the source 16 and drain 18 and the masking oxide is then removed. The source and drain can also be formed by diffusing the dopants into the body 14 in a manner well known in the art.

The source 16 and drain 18 thus formed will provide rectifying contact with the body 14 of germanium semiconductor material. The purpose of the rectifying contacts is to minimize the leakage current of the finished device.

After the source 16 and drain 18 are formed, a gate insulator 20 is formed over the body 14 of germanium semiconductor material. The gate insulator 20 can be formed from silicon oxide or silicon nitride. The gate insulator 20 can be deposited by a glow discharge process as disclosed, for example, in U.S. Pat. No. 4,226,898 which issued on Oct. 7, 1980 in the names of Stanford R. Ovshinsky and Arun Madan for Amorphous Semiconductors Equivalent To Crystalline Semiconductors. When the gate insulator 20 is formed from a silicon oxide, it can be deposited by the glow discharge decomposition of, for example, silane (SiH$_4$) and oxygen. When the gate insulator is formed from silicon nitride, it can be deposited from the glow discharge decomposition of silane and ammonia (NH$_3$).

To complete the device, a gate electrode 22 is formed over the gate insulator 20. The gate electrode 22 can be formed from any conductive metal such as aluminum or chromium.

The thin film field effect transistor thus formed as illustrated in FIG. 1 is truly integrated circuit compatible. Each of the processes required in forming the transistor 10 can be carried out at temperatures of 350° C. or below. At these processing temperatures, the other components associated with the integrated circuit compatible thin film field effect transistor being formed will not be adversely affected. For example, if the transistor 10 is formed in association with amorphous silicon alloy thin film field effect transistors which have already been processed, the electrical characteristics of the amorphous silicon alloys will be unaffected. In addition, the germanium semiconductor material body 14 will have a very high field effect mobility. The field effect mobility of the body 14 of germanium semiconductor material will be 40 or greater, which is considerably greater than the field effect mobilities of amorphous semiconductor alloys. Additionally, the field effect transistor 10 can be formed with conventional 10 micron lithography to permit commercial and large area utilization of the device 10. Although the source 16 and drain 18 will be spaced apart by a feature size of 10 microns, the transistor 10, by virtue of the high field effect mobility of the germanium semiconductor material, will exhibit switching speeds on the order of 50 Mhz or greater. This makes the transistor 10 especially suited for applications where video rate switching is required.

Figure 2:
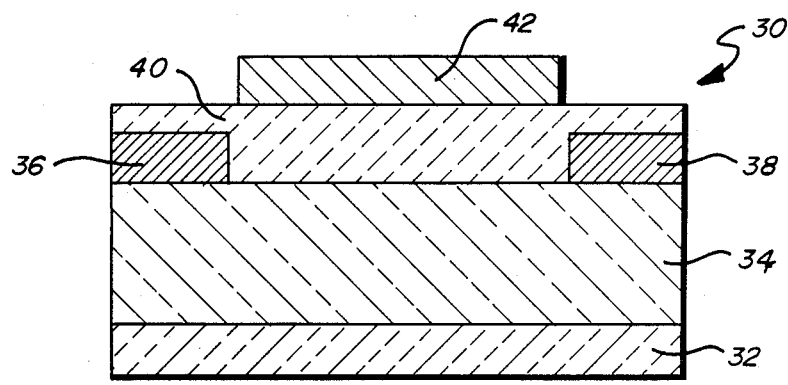
FIG. 2 is a cross-sectional side view of another integrated circuit compatible thin film field effect transistor embodying the present invention.

Referring now to FIG. 2, it illustrates another integrated circuit compatible thin film field effect transistor 30 embodying the present invention. The transistor 30 includes an insulative substrate 32 formed from glass, for example. Deposited on the substrate 32 in a manner as previously described is a body 34 of germanium semiconductor material having the electrical characteristics and structure as previously described. Unlike the transistor 10 of FIG. 1, the source electrode 36 and drain electrode 38 are formed on the body 34 of germanium semiconductor material. When the germanium semiconductor material is n-type, the source 36 and drain 38 can be formed by deposits of a high work function metal such as platinum or palladium. When the germanium semiconductor material is p-type, the source 36 and drain 38 can be formed by deposits of a low work function metal such as magnesium or ytterbium. These metals can be deposited by evaporation which is a relatively low temperature process. Formed over the source electrode 36, drain electrode 38, and the remaining portion of the body 34 of germanium semiconductor material is a gate insulator 40. The gate insulator can be formed from a silicon oxide or silicon nitride as previously described. To complete the device, a gate electrode 42 is formed over the gate insulator 40.

Because the source 36 and drain 38 are formed from a low or high work function metal depending on the conduction type of the germanium semiconductor material as previously explained, they will form rectifying contacts with the body 34 of germanium semiconductor material. These rectifying contacts serve the same function as the rectifying contacts formed by the source 16 and drain 18 of transistor 10.

Figure 3:
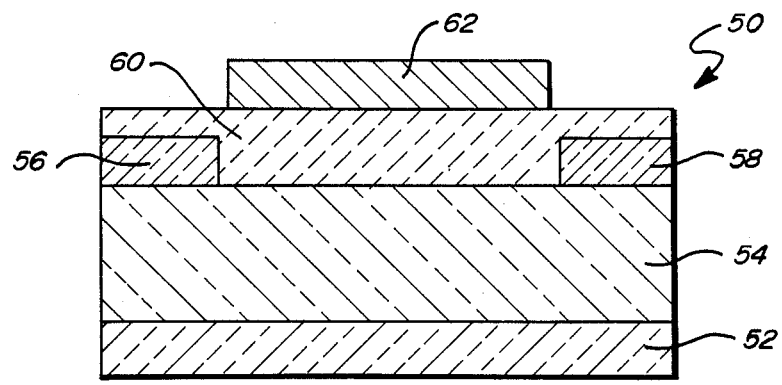
FIG. 3 is a cross-sectional side view of a still further integrated circuit compatible thin film field effect transistor embodying the present invention.

Referring now to FIG. 3, it illustrates a still further integrated circuit compatible thin film field effect transistor 50 embodying the present invention. The transistor 50 includes an insulative substrate 52 formed from, for example, glass, a body 54 of germanium semiconductor material deposited on the substrate 52 as previously described, and spaced apart source and drain electrodes 56 and 58 formed on the body 54 of germanium semiconductor material. In accordance with this preferred embodiment of the present invention, the source and drain 56 and 58, respectively, take the form of deposits of doped semiconductor material. Preferably, the doped semiconductor material comprises an amorphous silicon alloy containing hydrogen and/or fluorine. The doped semiconductor forming the source and drain 56 and 58 is preferably doped n-type with phosphorus when the body 54 of germanium semiconductor is slightly p-type or doped p-type with boron when the body 54 is slightly n-type. These amorphous semiconductor alloys are preferably deposited in a manner as fully described in the aforementioned U.S. Pat. No. 4,226,898. Preferably, the doped semiconductor material forming the source and drain 56 and 58 is n-type including fluorine. Such material has been found to be a superior n-type material in that it has very high electrical conductivity and exhibits substitutional doping characteristics. With the body 54 of germanium semiconductor material being $\pi$-type and the source 56 and drain 58 being formed from n-type amorphous silicon alloy material, the source and drain 56 and 58 will form rectifying contacts with the body 54 of germanium semiconductor material to the end of reducing the reverse leakage of the device.

Formed over the source 56, drain 58, and the body 54 of germanium semiconductor material is a gate insulator 60 which again, can comprise silicon oxide or silicon nitride. It can be formed as previously described.

The device 50 is completed with the formation of a gate electrode 62 over the gate insulator 60. Again, the gate electrode 62 can be formed from a conductive metal such as aluminum or chromium.

With respect to each of the embodiments of FIGS. 1 through 3 described herein, the bodies of germanium semiconductor material are preferably deposited to a thickness of about 2000 Å to 1 micron. The source and drains are preferably formed to have thicknesses on the order of 100 to 500 Å when formed from a p-type or an n-type region or a thickness of about 100 to 1000 Å when formed from a high work function metal. The gate insulators are preferably formed to have a thickness ranging between 300 to 5000 Å for disposing the gate electrodes adjacent the bodies of germanium semiconductor material and electrically insulated therefrom.

Also with respect to each of the embodiments of FIG. 1 through 3 described herein, when it is desired to cause the thin film field effect transistors to conduct, a positive potential is applied to both the gate and the source of the devices. The positive gate potential will cause a carrier inversion to take place within the bodies of the germanium semiconductor material so that electron accumulation takes place at the interface between the gate insulators and the bodies of germanium semiconductor material. This charge accumulation forms the current conducting channel within the devices for conducting the device current between the source and drain electrodes.

When it is desired to terminate conduction within the devices, the positive gate potential is removed to cause the accumulated charge at the interface of the gate oxide and the body of germanium semiconductor material to be depleted. When this occurs, the current will cease flowing between the source and drain electrodes. Because the source and drain form rectifying contacts with the bodies of germanium semiconductor material, they will preclude carrier injection in the reverse direction to thereby minimize the reverse leakage currents of the devices.

Figure 4:
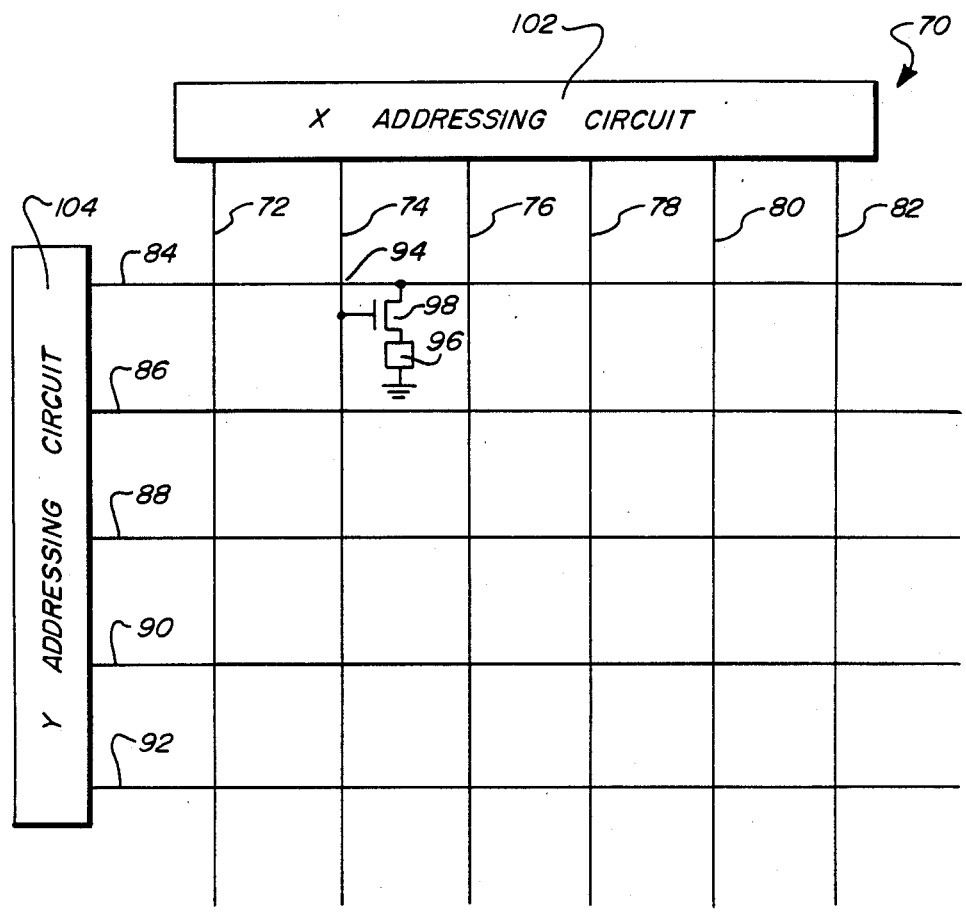
FIG. 4 is a schematic diagram, partially in block form, of an electronically addressable matrix array of the type which can utilize the integrated circuit compatible thin film field effect transistor of the present invention to advantage.

Referring now to FIG. 4, it illustrates a system 70 which can utilize the integrated circuit compatible thin film field effect transistors of the present invention to advantage. The system 70 is of the type which includes a plurality of X address lines 72, 74, 76, 78, 80, and 82 and a plurality of Y address lines 84, 86, 88, 90, and 92. The X and Y address lines are vertically spaced with respect to each other and cross at an angle to form a plurality of crossover points such as crossover point 94 formed by X address line 74 and Y address line 84. Associated with each crossover point is an array element, such as element 96 associated with crossover point 94. Also associated with each crossover point is an isolation device such as field effect transistor 98. As previously described, the isolation devices such as field effect transistor 98 serve to permit selective addressing of the array elements, such as element 96, and essentially isolates the non-addressed elements from the elements being addressed. Also as previously described, the thin film field effect transistor isolating devices preferably take the form of amorphous silicon alloy thin film field effect transistors because such transistors exhibit an extremely low reverse leakage. As illustrated in FIG. 4, the gate of transistor 98 is coupled to the X address line 74 and the source of transistor 98 is coupled to Y address line 84. The drain of transistor 98 is coupled to the element 96 to be addressed and the opposite side of the element 96 is coupled to a common potential, such as ground potential.

Associated with each of the X address lines 72 through 82 is an X addressing circuit 102 and associated with each of the Y address lines 84 through 92 is a Y addressing circuit 104. Addressing circuits of this type can include the integrated circuit compatible thin film field effect transistors of the present invention to distinct advantage. Circuits of this type utilizing field effect transistors are disclosed, for example, in an article entitled "A Liquid Crystal TV Display Panel With Drivers" which was published in SID Digest, Vol. 82, at pages 48 and 49. The X addressing circuit 102 and Y addressing circuit 104 provide read potentials between respective pairs of the X address lines and Y address lines so as to selectively address the elements of the array such as element 96. When the array is a liquid crystal display, the element 96 is a liquid crystal display pixel and when the array is a memory matrix, the element 96 can take the form of an individual memory cell.

By virtue of the present invention, the X addressing circuit 102 and the Y addressing circuit 104 can be integrated with the addressing lines, the isolation devices, and the elements to be selectively addressed. This is made possible by the low processing temperatures required to form the integrated circuit compatible thin film field effect transistors of the present invention.

From the foregoing, it can be appreciated that the present invention provides a truly integrated circuit compatible thin film field effect transistor which not only is integratable with existing semiconductor devices, but which also provides high-speed operation, as for example, switching speeds at video rates. Therefore, the integrated circuit compatible thin film field effect transistors of the present invention are ideally suited for use in addressing circuitry for liquid crystal video displays or fast readout electronically addressable memory arrays. The thin film field effect transistors of the present invention can be further formed by using conventional 10 micron photolithography. This renders the devices ideally suited for commercial and large area applications.

We claim:

1. An integrated circuit compatible thin film field effect transistor comprising:
    a body of semiconductor material, said body including a single semiconductor element, said semiconductor element being germanium, said germanium semiconductor material having a structure more ordered than amorphous germanium semiconductor material and less ordered than single crystalline germanium semiconductor material;
    source and drain electrodes of amorphous semiconductor material providing forming rectifying contacts with said body of germanium semiconductor material; and
    a gate electrode adjacent to and insulated from said body of germanium semiconductor material.

2. A thin film field effect transistor as defined in claim 1 wherein said source and drain electrodes are formed on said body of germanium semiconductor material.

3. A thin film field effect transistor as defined in claim 2 wherein said source and drain electrodes comprise deposits of a doped semiconductor on said body of germanium semiconductor material.

4. A thin film field effect transistor as defined in claim 3 wherein said amorphous semiconductor alloy includes silicon.

5. A thin film field effect transistor as defined in claim 4 wherein said amorphous silicon alloy, includes hydrogen.

6. A thin film field effect transistor as defined in claim 4 wherein said amorphous silicon alloy includes fluorine.

7. A thin film field effect transistor as defined in claim 3 wherein said body of germanium semiconductor material is p-type and said doped semiconductor is n-type.

8. A thin film field effect transistor as defined in claim 7 wherein said doped semiconductor includes phosphorus.

9. A thin film field effect transistor as defined in claim 3 wherein said body of germanium semiconductor material is n-type and said doped semiconductor is p-type.

10. A thin film field effect transistor as defined in claim 1 wherein said body of germanium semiconductor material further includes hydrogen.

11. A thin film field effect transistor as defined in claim 1 wherein said body of germanium semiconductor material further includes fluorine.

12. A thin film field effect transistor as defined in claim 1 further including an insulative layer disposed between said gate electrode and said body of germanium semiconductor material.

13. A thin film field effect transistor as defined in claim 12 wherein said insulative layer is formed from silicon oxide or silicon nitride.

14. A thin film field effect transistor as defined in claim 1 wherein said gate electrode is formed from a metal.

15. A thin film field effect transistor as defined in claim 14 wherein said metal is chromium or aluminum.

16. A system for selectively addressing each element of an array of elements, said system comprising:
    a first set of address lines;
    a second set of address lines spaced from and crossing at an angle to said first set of address lines to form a plurality of crossover points therewith;
    each said crossover point being associated with a given one of said elements to be addressed;
    an isolation device associated with each said element to be addressed; and
    addressing circuitry coupled to said first and second sets of address lines for selectively applying addressing potentials to respective pairs of said first and second sets of address lines, said addressing circuitry including at least one integrated circuit compatible thin film field effect transistor comprising a body of semiconductor material, said body including a single semiconductor element, said semiconductor element being germanium, said germanium semiconductor material having a structure more ordered than amorphous germanium semiconductor material and less ordered than single crystalline germanium semiconductor material, source and drain electrodes formed by amorphous semiconductor material providing rectifying contacts with said body of germanium semiconductor material, and a gate electrode adjacent to and insulated from said body of germanium semiconductor material.

17. A system as defined in claim 16 wherein said source and drain electrodes of said thin film field effect transistor are formed on said body of germanium semiconductor material.

18. A system as defined in claim 17 wherein said source and drain electrodes comprise deposits of a doped semiconductor on said body of germanium semiconductor material.

19. A system as defined in claim 18 wherein said amorphous semiconductor alloy includes silicon.

20. A system as defined in claim 19 wherein said amorphous silicon alloy includes hydrogen.

21. A system as defined in claim 19 wherein said amorphous silicon alloy includes fluorine.

22. A system as defined in claim 18 wherein said body of germanium semiconductor material is p-type and said doped semiconductor is n-type.

23. A system as defined in claim 22 wherein said doped semiconductor includes phosphorus.

24. A system as defined in claim 18 wherein said body of germanium semiconductor material is n-type and said doped semiconductor is p-type.

25. A system as defined in claim 16 wherein said body of germanium semiconductor material of said thin film field effect transistor further includes hydrogen.

26. A system as defined in claim 16 wherein said body of germanium semiconductor material of said thin film field effect transistor further includes fluorine.

27. A system as defined in claim 16 wherein said thin film field effect transistor further includes an insulative layer disposed between said gate electrode and said body of germanium semiconductor material.

28. A system as defined in claim 27 wherein said insulative layer is formed from silicon oxide or silicon nitride.

29. A system as defined in claim 16 wherein said gate electrode of said thin film field effect transistor is formed from a metal.

30. A system as defined in claim 29 wherein said metal is chromium or aluminum.

31. A system as defined in claim 16 wherein said isolation devices comprise thin film field effect transistors including amorhpous semiconductor alloy materials.

* * * * *